United States Patent
Weller

(10) Patent No.: US 7,902,532 B2
(45) Date of Patent: Mar. 8, 2011

(54) SYSTEMS AND METHODS INVOLVING TRANSDUCER SIGNALS

(75) Inventor: Nathan Andrew Weller, Gardnerville, NV (US)

(73) Assignee: General Electric Company, Schenectady, NY (US)

( * ) Notice: Subject to any disclaimer, the term of this patent is extended or adjusted under 35 U.S.C. 154(b) by 100 days.

(21) Appl. No.: 12/355,251

(22) Filed: Jan. 16, 2009

(65) Prior Publication Data

US 2010/0182069 A1 Jul. 22, 2010

(51) Int. Cl.
G02B 27/00 (2006.01)

(52) U.S. Cl. ........................ 250/551; 327/187

(58) Field of Classification Search ............... 250/551, 250/214.1, 214 A; 327/187
See application file for complete search history.

(56) References Cited

U.S. PATENT DOCUMENTS

| 4,039,863 A | 8/1977 | Ohhinata et al. |
| 4,801,821 A * | 1/1989 | Prevost et al. ............... 327/187 |

* cited by examiner

Primary Examiner — Seung C Sohn
(74) Attorney, Agent, or Firm — Cantor Colburn LLP

(57) ABSTRACT

A system for operating a transducer comprising, a first node connected to a first transducer, a first photo-activated switching device having a first source, a first drain connected to the first node, and a first gate operative to receive a first logic signal, a first terminal connected to the first source; a second photo-activated switching device having a second source connected to the first node, a second drain, and a second gate operative to receive a second logic signal, and a second terminal connected to the second drain.

19 Claims, 2 Drawing Sheets

SYSTEMS AND METHODS INVOLVING TRANSDUCER SIGNALS

BACKGROUND OF THE INVENTION

The subject matter disclosed herein relates to conditioning, controlling, and driving transducer signals.

Many systems include processors that operate at low voltages (e.g. +/−3.3V) and receive conditioned signals from sensors such as transducers. Transducers often use particular voltage, current, and impedance operation parameters to function properly. The operating parameters of a particular transducer are often incompatible with the operating voltages of processors that operate at relatively low voltages. Previous systems have used a variety of circuits to operate the transducers at designed parameters, and output the signal from the transducer to a processor however; the systems lack flexibility to easily change a particular transducer. The design considerations for a circuit that operates a transducer become more complex when a designer attempts to isolate the operation of the transducer from logic signals used by a low voltage processor.

The replacement of a transducer having a particular operating parameter with another transducer having a different operating parameter may result in a redesign of the associated operating circuits. The redesign is inefficient, and may cause difficulty in meeting desired packaging specifications.

A flexible system and method that allows a variety of transducers to operate at designed operating parameters is desired.

BRIEF DESCRIPTION OF THE INVENTION

According to one aspect of the invention, a system for operating a transducer comprising, a first node connected to a first transducer, a first photo-activated switching device having a first source, a first drain connected to the first node, and a first gate operative to receive a first logic signal, a first terminal connected to the first source; a second photo-activated switching device having a second source connected to the first node, a second drain, and a second gate operative to receive a second logic signal, and a second terminal connected to the second drain.

According to another aspect of the invention, a transducer signal control circuit comprising, a first node connected to a first transducer, a first photo-activated switching device having a first source, a first drain connected to the first node, and a first gate operative to receive a first logic signal, a first terminal connected to the first source, a second photo-activated switching device having a second source connected to the first node, a second drain, and a second gate operative to receive a second logic signal, and a second terminal connected to the second drain.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
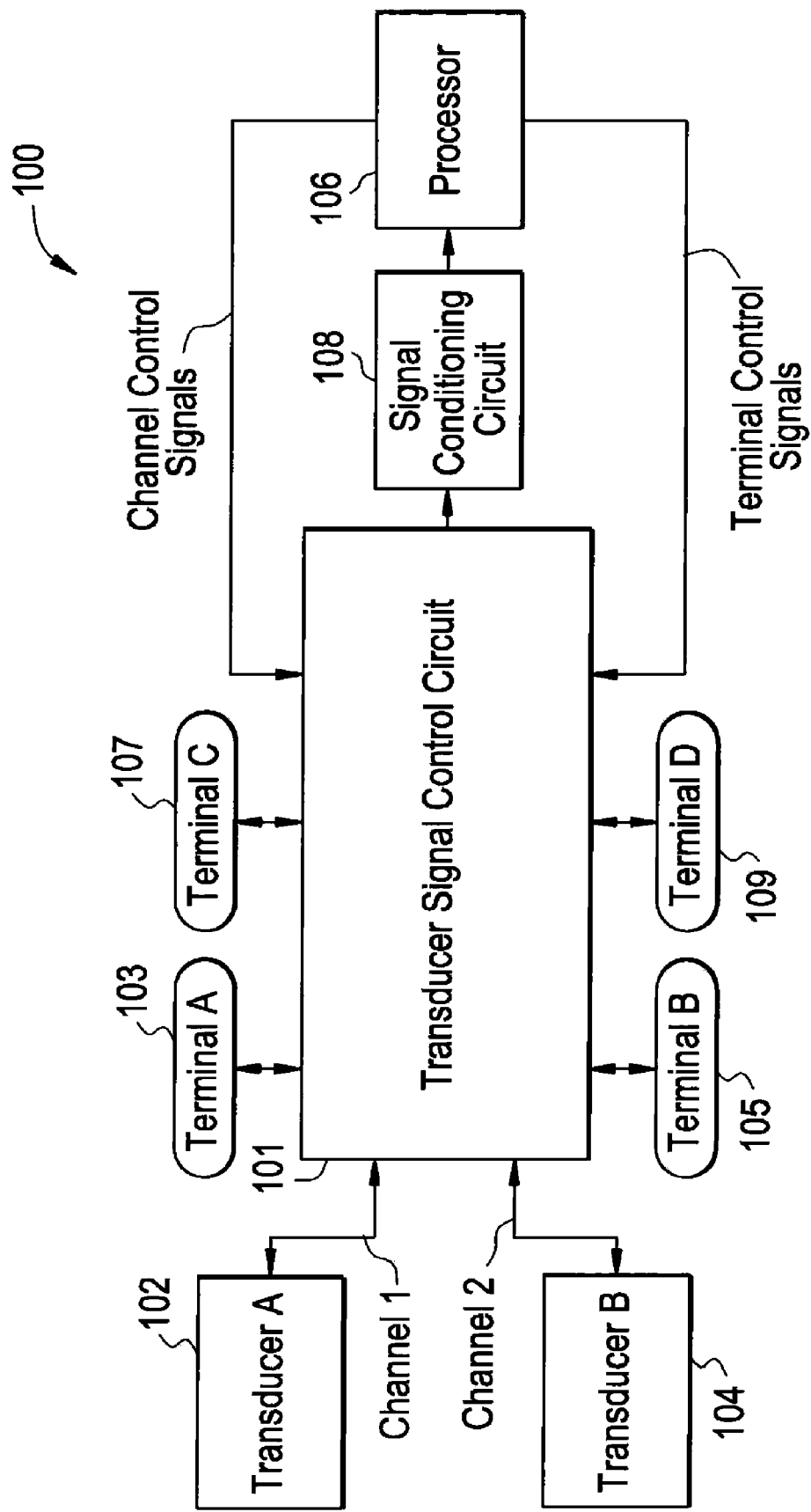
FIG. 1 is a block diagram of an exemplary embodiment of a system for controlling transducer signals.

FIG. 1 illustrates a block diagram of a system 100 for controlling transducer signals. The system 100 includes a transducer signal control circuit 101 communicatively connected to a transducer A 102 via a channel 1 and a transducer B 104 via a channel 2. The transducer signal control circuit 101 is communicatively connected to terminals A-D (103, 105, 107, and 109), and receives channel control signals and terminal control signals from a processor 106. The processor 106 is communicatively connected to an output of the transducer signal control circuit 101. Some embodiments of the system 100 may include a signal conditioning circuit 108 connected between the output of the transducer signal control circuit 101 and the processor 106. The transducers may include any type of transducer, for example electromagnetic, electrochemical, electroacoustic, electrostatic, radioacoustic, thermoelectric, and photoelectric type transducers. Though the illustrated embodiment includes two transducers, the system 100 may include any number of transducers, and the transducer signal control circuit 101 may be expanded to include a corresponding number of channel inputs and terminals. The system 100 is not limited to one processor 106, and may include any number of processors.

In operation, the transducers output signals to the transducer signal control circuit 101. The transducer signal control circuit 101 is connected to the terminals that may be connected to a variety of bus bars that provide a desired electrical parameter that may be associated with the operation of the transducers. For example, some transducers use a driving current or voltage to operate, while other transducers use an impedance value for operation. The transducer signal control circuit 101 offers flexibility in that the different transducers may be connected to the transducer signal control circuit 101 that use the terminals having different electrical parameters. The connections of the terminals to a particular transducer are controlled by logic signals (terminal control signals) sent to the transducer signal control circuit 101 from the processor 106. The transducer signal control circuit 101 may be controlled to output a single signal received from a particular transducer via a single output. Thus, a particular input channel may be selected by the processor 106 to be output from the transducer signal control circuit 101. The channel control signals output by the processor 106 control the output channel of the transducer signal control circuit 101. In some embodiments, the output signal from the transducer signal control circuit 101 may be conditioned by the signal conditioning circuit 108 prior to sending the output signal to the processor 106. Conditioning may include, for example, lowering or increasing the voltage of the output signal.

Figure 2:
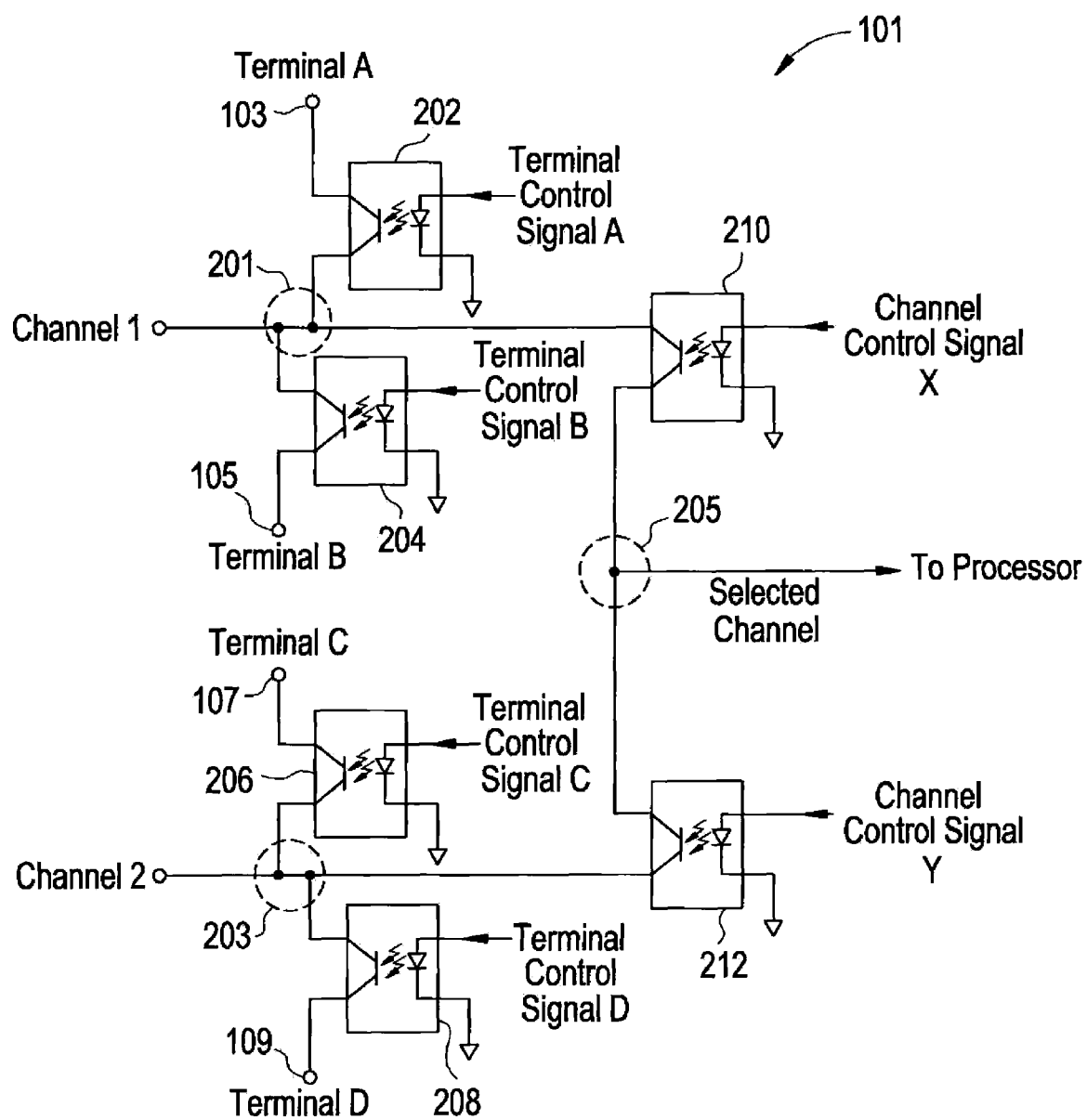
FIG. 2 is an exemplary embodiment of a circuit diagram of the transducer signal control circuit of FIG. 1.

FIG. 2 illustrates an exemplary embodiment of a circuit diagram of the transducer signal control circuit 101 (of FIG. 1). The circuit 101 includes a photo-actuating switching device 202 that may include, for example, a photo-activated switch, a phototransistor, or a similar photo-activated component. The photo-actuating switching device 202 has a source connected to the terminal A 103, a drain connected to a first node 201, and a gate that receives a terminal control signal A. A photo-actuating switching device 204 has a source connected to the first node 201, a drain connected to the terminal B 105, and a gate connected to a terminal control signal B. A photo-actuating switching device 206 has a source connected to the terminal C 107, a drain connected to a second node 203, and a gate connected to a terminal control signal B. A photo-actuating switching device 208 has a source connected to the second node 203, a drain connected to a terminal D 109, and a gate connected to a terminal control signal D. The first node is connected to the channel 1, and the second node is connected to the channel 2. A photo-actuating switching device 210 has a source connected to the first node 201, a drain connected to an output node 205, and a gate that receives a channel control signal X. A photo-actuating switching device 212 has a source connected to the second node 203, a drain connected to the output node 205, and a gate that receives a channel control signal Y. Though the illustrated embodiment of FIG. 2 includes two channels, other embodiments may be expanded to include any number of channels, and associated transducers, photo-actuating switching devices, and logic signals.

In operation, the processor 106 sends the terminal control signal A and the terminal control signal B as logic outputs to control the photo-actuating switching devices 202 and 204 respectively. When a logic output is high, the photo-actuating switching device connected to the logic closes. The photo-actuating switching devices 202 and 204 operate by converting the high logic output to light using, for example, a light emitting diode (LED). The light emitted from the LED causes a transitive element in the photo-actuating switching devices 202 and 204 to turn on, closing the electrical connection between the source and the drain. Since the photo-actuating switching devices 202 and 204 control the connection between the terminals A and B and the first node 201, the logic from the processor 106 via the terminal control signals A and B determines whether the transducer connected to the channel 1 is affected by the terminals A and B. The photo-actuating switching devices 206 and 208 and the associated inputs operate in a similar manner.

The photo-actuating switching devices 210 and 212 act as switches to control the output channel signal from the output node 205. For example, when the channel control logic signal X is high and the channel control logic signal Y is low, the photo-actuating switching device 210 is closed, the photo-actuating switching device 212 is open, and the channel 1 signal is output via the output node 205. Thus, a desired signal from a channel may be output from the output node 205 by closing the photo-actuating switching device associated with the desired channel, and opening the photo-actuating switching devices associated with the other channels. The signal from the output node may then be sent to the processor 106 (after signal conditioning if desired), or other similar devices.

The use of the photo-actuating switching devices allows logic signals sent directly from the processor 106 at the operating voltage of the processor to directly select and control the output signal from the circuit 101 and to configure the circuit 101 to operate with a variety of transducer types. The photo-actuating switching devices also improve the reliability and performance of the circuit 101 by electrically isolating the logic signals sent by the processor 106 from the currents associated with the terminals and the channels. The circuit 101 offers considerable design flexibility. For example, a transducer that is connected to a channel may be replaced with a different type of transducer. If the different type of transducer does not use inputs from the terminals, one or both terminals may be switched off via the photo-actuating switching devices. Photo-actuating switching devices may be used that operate over a large range of gate voltage inputs allowing the processor 106 to include any number of different types of processors that operate at different voltages. Thus, the processor 106 may be easily replaced without a change to the design of the circuit 101, or a plurality of processors outputting different logic voltages may be used to control the circuit.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A system for operating a transducer comprising:
    a first node connected to a first transducer;
    a first photo-activated switching device having a first source, a first drain connected to the first node, and a first gate operative to receive a first logic signal;
    a first terminal connected to the first source;
    a second photo-activated switching device having a second source connected to the first node, a second drain, and a second gate operative to receive a second logic signal; and
    a second terminal connected to the second drain.

2. The system of claim 1, wherein the system further comprises:
    a third photo-activated switching device having a third source connected to the first node, a third drain, and a third gate operative to receive a third logic signal; and
    an output node connected to the third drain.

3. The system of claim 1, wherein the first terminal is operative to drive the first transducer.

4. The system of claim 1, wherein the second terminal is operative to drive the first transducer.

5. The system of claim 1, wherein the first gate is connected to an output terminal of a processor.

6. The system of claim 1, wherein the second gate is connected to an output terminal of a processor.

7. The system of claim 2, wherein the third gate is connected to an output terminal of a processor.

8. The system of claim 2, wherein the output node is connected to an input of a signal conditioning circuit.

9. The system of claim 8, wherein the signal conditioning circuit is connected to a processor.

10. The system of claim 2, wherein the output node is connected to an input of a processor.

11. The system of claim 1, wherein the second terminal is a ground terminal.

12. A transducer signal control circuit comprising:
    a first node connected to a first transducer;
    a first photo-activated switching device having a first source, a first drain connected to the first node, and a first gate operative to receive a first logic signal;
    a first terminal connected to the first source;
    a second photo-activated switching device having a second source connected to the first node, a second drain, and a second gate operative to receive a second logic signal; and
    a second terminal connected to the second drain.

13. The circuit of claim 12, wherein the circuit further comprises:
    a second node connected to a second transducer;

a third photo-activated switching device having a third source, a third drain connected to the second node, and a third gate operative to receive a third logic signal;

a third terminal connected to the third source;

a fourth photo-activated switching device having a fourth source connected to the second node, a fourth drain, and a fourth gate operative to receive a fourth logic signal; and a fourth terminal connected to the fourth drain.

14. The circuit of claim 12, wherein the circuit further comprises:

an output node; and a fifth photo-activated switching device having a fifth source connected to the first node, a fifth drain connected to the output node, and a fifth gate operative to receive a fifth logic signal.

15. The circuit of claim 13, wherein the circuit further comprises a sixth photo-activated switching device having a sixth source connected to the second node, a sixth drain connected to the output node, and a sixth gate operative to receive a sixth logic signal.

16. The circuit of claim 12, wherein the first terminal is operative to drive the first transducer.

17. The circuit of claim 12, wherein the second terminal is operative to drive the first transducer.

18. The circuit of claim 12, wherein the first gate is connected to an output terminal of a processor.

19. The circuit of claim 12, wherein the second gate is connected to an output terminal of a processor.

* * * * *